United States Patent
Duttweiler

[19]

[11] Patent Number: 5,951,626
[45] Date of Patent: Sep. 14, 1999

[54] ADAPTIVE FILTER

[75] Inventor: Donald Lars Duttweiler, Rumson, N.J.

[73] Assignee: Lucent Technologies Inc., Murray Hill, N.J.

[21] Appl. No.: 08/953,120

[22] Filed: Oct. 17, 1997

[51] Int. Cl.$^6$ .................................................. G06F 17/10
[52] U.S. Cl. ........................................................ 708/322
[58] Field of Search .................... 364/724.01, 724.19, 364/724.2; 348/661; 370/286–292; 379/410, 411; 455/570

[56] References Cited

U.S. PATENT DOCUMENTS

| | | | |
|---|---|---|---|
| 4,349,889 | 9/1982 | Van den Elzen et al. | 364/724.19 |
| 4,491,701 | 1/1985 | Duttweiler et al. | 364/724.19 |
| 5,805,480 | 9/1998 | Greenberg | 364/724.19 |

*Primary Examiner*—Chuong Dinh Ngo
*Attorney, Agent, or Firm*—Jeffery J Brosemer

[57] ABSTRACT

An adaptive filter and method that proportionately adjusts individual tap gain distributors such that the individually adjusted tap gains are not necessarily equal to one another and that the average of tap gains remains substantially constant. The filter employs a proportionate normalized least-means-squares (PNLMS) method of adaptation that imparts improved convergence speed over prior art adaptive filters that utilize a normalized least-means-squares (NLMS) method of adaptation, without affecting the adaptation quality of the filter.

10 Claims, 3 Drawing Sheets

ADAPTIVE FILTER

TECHNICAL FIELD

This invention relates generally to the field of signal processing and in particular to an adaptive filter.

BACKGROUND OF THE INVENTION

Adaptive filters operate on a supplied signal in a prescribed manner such that a desired output signal is generated. Typically, adaptive filters generate a transfer function according to an algorithm that includes updating of the transfer function characteristic in response to an error signal. In this manner, the filter characteristic is optimized to produce a desired result.

When used in an echo canceler, an adaptive filter is used to generate an echo path estimate that is updated in response to an error signal. Echos commonly occur because of imperfect coupling of incoming signals at 4-to-2 wire junctions in communications systems. The echos typically result because the impedance of the 2-wire facility is imperfectly balanced in the 4-to-2 wire junction causing the incoming signal to be partially reflected over an outgoing path to the source of incoming signals.

Adaptive echo cancelers have been employed to mitigate the echoes by adjusting the transfer function (impulse response) characteristic of an adaptive filter to generate an estimate of the reflected signal or echo and, then, subtracting it from the outgoing signal. The filter impulse response characteristic and, hence, the echo estimate is updated in response to the outgoing signal for more closely approximating the echo to be cancelled.

Although prior art arrangements of adaptive filters perform satisfactorily in some applications, often it is impossible to simultaneously achieve both sufficiently fast response to changing echo paths and sufficiently high steady-state estimation quality. Consequently a continuing need is to achieve more rapid response to changing conditions while at the same time maintaining adequate steady-state estimation quality.

SUMMARY OF THE INVENTION

The above problems are overcome and advance is made over the prior art in accordance with the principles of the present invention wherein an adaptive filter utilizes a proportionate, normalized least-mean-squares (PNLMS) method of adaptation. The method advantageously adapts significantly faster that the prior art normalized least-mean-squares (NLMS) methods, while not sacrificing estimation quality nor significantly adding to the computational complexity.

In accordance with the present invention, the adaptive filter individually adjusts gain distributors associated with positions along a tapped delay line such that the individual gain distributors are not necessarily equal to one another while, at the same time, ensuring that an average of the gain distributors is substantially constant. In this manner, adaptive "energy" is unevenly distributed across the taps.

In a preferred embodiment, the present invention includes a gain normalization feedback loop in which a normalization signal is derived from a power estimate of an applied signal.

Further features and advantages of the present invention, as well as the structure and operation of various embodiments of the present invention are described in detail below with reference to the accompanying drawing.

BRIEF DESCRIPTION OF THE DRAWING

The teachings of the present invention can be readily understood by considering the following detailed description in conjunction with the accompanying drawings, in which.

DETAILED DESCRIPTION

A preferred embodiment of the invention will now be described while referring to the figures, several of which may be simultaneously referred to during the course of the following description.

Figure 1:
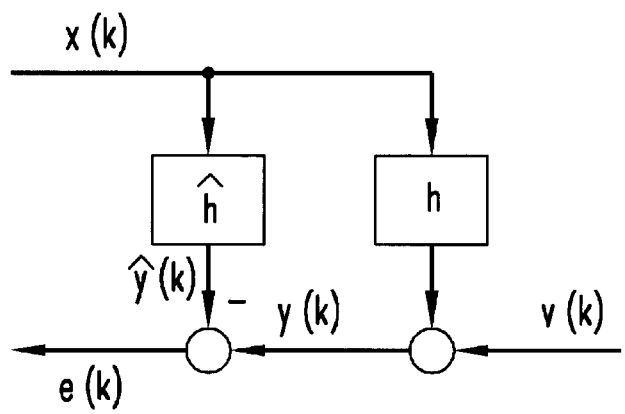
FIG. 1 shows, in simplified block diagram form, adaptive filter (echo canceler) deployment and key signals.

With reference now to FIG. 1, there is shown a block diagram depicting typical adaptive filter (echo canceler) deployment in a telephone plant. The signal x(k) (often referred to as the far-end signal) excites an echo path. By convention, the signal y(k) is the sum of any speech v(k) from a near end customer and an echo that is a filtering of x(k) by an unknown echo-path impulse response, h. Since terminology used to distinguished between y(k) and v(k) is oftentimes ambiguous, "near-end signal" will be used herein to refer to y(k) and "near-end speech" or "near-end noise" to refer to v(k).

As previously noted, an echo that manifests itself in such telephonic application occurs in a hybrid that converts four-wire transmission of a long-distance plant into two-wire transmission of a local loop. An echo canceler filters x(k) by an echo-path estimate $\hat{h}$ to obtain an echo estimate $\hat{y}(k)$. If, as suggested in FIG. 1, that $\hat{h}$ is a good estimate of h, then $\hat{y}(k)$ cancels the echo component of y(k) so that return signal (or error signal) e(k) is roughly equivalent to near-end speech v(k).

Of course, the quality of any echo canceler is largely determined by how closely the echo-path estimate $\hat{h}$ matches the echo impulse response h. Frequently, the prior art has employed a normalized least-mean-squares (NLMS) method to adaptively learn $\hat{h}$. Those skilled in the art will quickly recognize relationships that are important to this method include:

$$\hat{y}(k) = \sum_{n=0}^{N-1} \hat{h}_n(k)x(k-n); \tag{1}$$

$$e(k) = y(k) - \hat{y}(k); \tag{2}$$

$$\hat{\sigma}_x^2 = \frac{1}{N}\sum_{n=0}^{N-1} x^2(k-n); \text{ and} \tag{3}$$

$$\hat{h}_n(k+1) = \hat{h}_n(k) + \frac{\lambda}{N}\frac{e(k)x(k-n)}{\hat{\sigma}_x^2(k)}; \tag{4}$$

where N is a measure of the length of the echo canceler, as determined by the number of taps contained therein (often 256, 512, or 1024 taps), $\lambda$ is a parameter known as the adaptive-filter gain and $\hat{\sigma}^2$ is an estimate of the variance (rms power) of the input signal x(k).

A common source of confusion associated with these relationships is the two "times" that are being represented therein. Specifically, both real time and the time along an estimated impulse response are represented by these relationships. A useful convention to minimize this confusion is to represent real time parenthetically (with the index k) and tap position as a subscript (with the index n) as is done here. Thus, $\hat{h}_n(k)$ is an estimate of the $n^{th}$ tap of the impulse response at time k.

Practical echo cancelers need to supplement the basic NLMS adaptive filtering method represented by Equations 1 through 4 with a variety of "fixes" thereby enhancing their echo canceling ability. Such fixes include far-end speech detection, near-end-speech detection, and residual echo control and disabler-tone detection.

Analyzing the statistical performance of the NLMS method is possible when the input signals x(k) and v(k) are stationary random processes. First, an assumption is made that $\hat{\sigma}_x^2(k)$ is constant and equal to $\sigma_x^2$, the true variance of x(k). Replacing $\hat{\sigma}_x^2(k)$ in Equation (4) by $\sigma_x^2$ gives the well-known least-mean-squares (LMS) method, which those skilled in the art will readily recognize and know as being extensively studied.

Two key factors determine the convergence rate and convergence quality of adaptive filters using the NLMS method. Specifically, if x(k) and v(k) are assumed to be independent white Gaussian noise processes with zero mean and variances $\sigma_x^2$ and $\sigma_v^2$, then the convergence rate R in dB per sample is given by:

$$R = \frac{10}{\ln N} \frac{1}{N} \lambda(2 - \lambda); \tag{5}$$

and the steady state power $\rho_\infty^2$ of the error signal e(k) is given by $$\rho_\infty^2 = \sigma_v^2 \frac{\lambda}{2 - \lambda} + \sigma_v^2. \tag{6}$$

As can be readily seen, the convergence rate R, is inversely proportional to the canceler length N and increases with $\lambda$ for typically small $\lambda$ (less than 1). The fastest convergence is achieved for a given length N, with $\lambda$ equal to 1. However, the steady state error also increases with $\lambda$ for typically small $\lambda$.

My proportionate, normalized least-mean-squares (PLNMS) method, which is the subject of the present invention differs from the above NLMS method in that the available adaption "energy" is distributed unevenly over the N taps contained within the adaptive filter. Mathematically, the relationships necessary to describe this proportionate adaption are stated as follows:

$$\hat{y}(k) = \sum_{n=0}^{N-1} \hat{h}_n(k) x(k - n); \tag{7}$$

$$e(k) = y(k) - \hat{y}(k); \tag{8}$$

$$L_\infty(\hat{h}(k)) = \max\{|\hat{h}_0(k)|, \ldots, |\hat{h}_{N-1}(k)|\}; \tag{9}$$

$$L'_\infty(\hat{h}(k)) = \max\{\delta, L_\infty(\hat{h}(k))\}; \tag{10}$$

$$g_n(k) = \max\{\rho L_\infty(\hat{h}(k)), |\hat{h}_n(k)|\}; \tag{11}$$

$$\bar{g}(k) = \frac{1}{N} \sum_{n=0}^{N-1} g_n(k); \tag{12}$$

-continued $$\hat{\sigma}_x^2 = \frac{1}{N} \sum_{n=0}^{N-1} x^2(k - n); \text{ and} \tag{13}$$

$$\hat{h}_n(k + 1) = \hat{h}_n(k) + \frac{\lambda}{N} \frac{g_b(k)}{\bar{g}(k)} \frac{e(k) x(k - n)}{\hat{\sigma}_x^2(k)}. \tag{14}$$

Those skilled in the art will readily appreciate that N and $\lambda$ are parameters from the NLMS method, namely the filter length and loop gain respectively. New parameters $\rho$ and $\delta$ are employed to effect small signal regularization. For N equal to 512, a reasonable initial parameterization is to set both equal to 0.01.

To appreciate how the PNLMS method operates, assume that $\rho$ is equal to zero. With $\rho$ equal to zero the gain distributors $g_n(k)$ are proportional to the magnitude of the current impulse-response-sample estimates $\hat{h}_n(k)$. Update equation (14) differs from update equation (4) by the $g_n(k)/\bar{g}(k)$ term. The average of these terms is equal to one. Consequently, tap weights that are estimated as far from zero get significantly more update energy than those estimated as close to zero.

The significance of parameter $\rho$ may be understood by way of example. Specifically, if one were to parameterize the PNLMS method with $\rho$ equal to zero, and if an estimate $\hat{h}_n(k)$ happened to equal zero, it would remain "stuck" at zero forever. The introduction of $\rho$ circumvents this problem. More specifically, it clamps the gain distributors g(k) associated with small impulse-response samples to a fraction $\rho$ of the gain distributor associated with the largest-magnitude impulse-response sample.

Finally, parameter $\delta$ is employed to overcome another peculiar problem associated with implementation. Specifically, $\delta$ ensures that $L'_\infty$ will be non-zero even when all of the $\hat{h}_n(k)$ are zero as is typically the case after the adaptive filter is reset.

Figure 2:
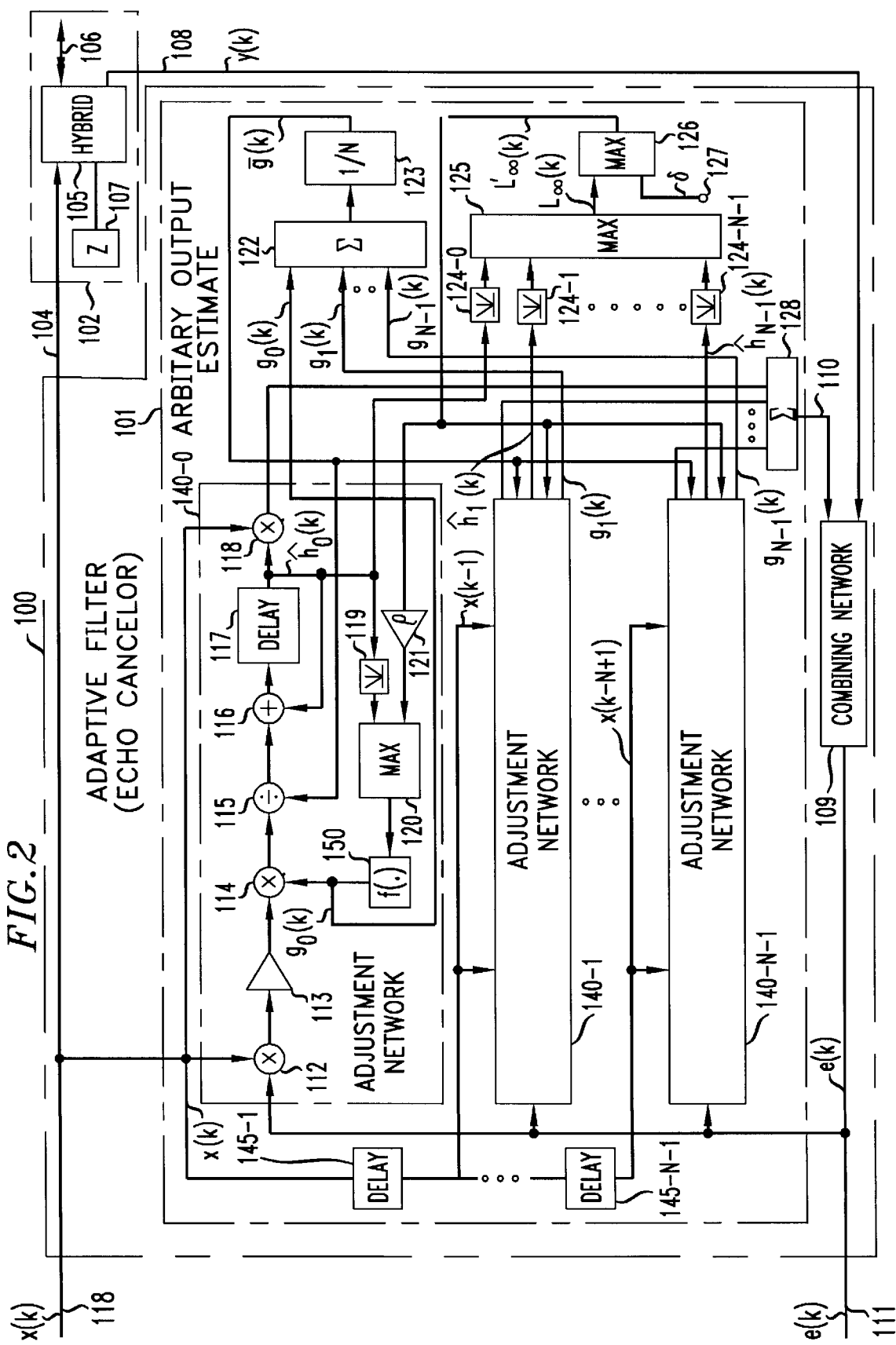
FIG. 2 shows in simplified block diagram form an adaptive filter including an embodiment of the present invention.

With this theoretical basis in place and with reference now to FIG. 2, adaptive filter 100 including an embodiment of the present invention is shown in simplified block diagram form. Other than the inventive concept, those skilled in the art will quickly recognize that adaptive filter 100 is broadly similar to the adaptive filter used in echo cancelers disclosed in U.S. Pat. Nos. 3,499,999, 3,500,000, and 4,468,641. Also, for further background on such application, see an article entitled "Bell's Echo-Killer Chip", IEEE Spectrum, October, 1980, pages 34–37.

Briefly, adaptive filter 100 includes an adjustable signal processor, i.e., adaptive filter, having a closed loop error control system which is self-adapting in that it automatically tracks signal variation in an outgoing path. More specifically, filter 100 employs arbitrary system output estimator 101 including an adaptive transversal filter arrangement for synthesizing a linear approximation of arbitrary system 102.

Toward this end, far end incoming signal x(k) may be supplied from a far end signal source over a first transmission path, e.g., lead 118, to a first input of adaptive filter 100 and therein to an input of arbitrary system output estimator 101. Those skilled in the art will quickly recognize that signal x(k) may be, for example, a digitally sampled speech signal, where k is an integer identifying the sampling interval which in the case of digitally sampled speech is typically the reciprocal of 8 kHz.

Far end signal x(k) is also supplied via lead 104, perhaps through some conversion circuitry, e.g., a digital-to-analog converter (not shown), to a first input of arbitrary system 102. In an echo canceler application, arbitrary system 102 will include hybrid 105, matching balance impedance 107, and bi-directional transmission path 106. The input signal to hybrid 105 from lead 104 is supplied over bi-directional path 106 to a near-end listening party. However, because of an impedance mismatch in hybrid 105, typically caused by balance impedance 107 not exactly matching the impedance of bi-directional path 106, a portion of the hybrid input signal appears on outgoing lead 108 and is reflected to the far end signal source as an echo signal.

Estimator 101 will generate a system output signal that differs from that of arbitrary system 102 until adaptive filter 100 converges to the arbitrary system characteristic. The output of arbitrary system 102 is, therefore, equivalent to the echo signal often encountered in the echo canceler application previously described.

The output signal of arbitrary system 102 is supplied over lead 108 to another input of filter 100 and therein to a first input of combining network 109. Lead 108 may also include conversion apparatus, e.g., an analog-to-digital converter (not shown). A second input to the combining network 109, is a signal estimate of the arbitrary system output signal generated by estimator 101. The arbitrary system output estimate is supplied via lead 110 to a second input of combining network 109. Combining network 109 generates error signal e(k) corresponding to the algebraic difference between the arbitrary system output estimate from estimator 101 and the output from arbitrary system 102. Error signal e(k) is supplied over a second transmission path, e.g., lead 111 to the far end source and to estimator 101.

Estimator 101 includes a so-called tapped delay line comprised of delay units 145-1 through 145-(N−1), for realizing desired delays at the taps corresponding to convenient intervals. Therefore, delayed replicas x(k−1) through x(k−N+1) of incoming far end signal x(k) are generated at the corresponding taps. The signal at each tap position, is adjusted in response to error signal e(k). More particularly, signals x(k) through x(k−N+1) are individually weighted in response to x(k) via a corresponding one of adjustment networks 140-0 through 140-(N−1), respectively.

In accordance with the present inventive concept, adjustment networks 140-0 through 140-(N−1) each include multipliers 112, 114 and 118; amplifiers 113, 121; divider 115; adder 116; delay element 117; rectifier 119; and max element 120. Adjustment network feedback loops proportionally adjust the tap gain distributors to a desired value such that the adaption "energy" or "gain" is distributed unevenly across the taps in a manner that should be readily apparent to those skilled in the art. Specifically, signal $\hat{h}_n(k)$ is applied to adder 116 and as an input to rectifier 119. Additionally, signal $g_0(k)$ is fed back through multiplier 114, and is produced by max element 120 that has as its input $\hat{h}_0(k)$ rectified by rectifier 119 and $L'_\infty$ applied through amplifier 121. Finally, signal $\bar{g}(k)$, the average of all of the $g_n(k)$ signals produced by a respective adjustment network 145-N, is fed back through divider 115. Importantly, signal $g_0(k)$ may be adjusted according to an arbitrary, monotonically increasing function $f(.)$, shown provided by adjuster element 150.

Signal $L'_\infty$ is produced from the tap output $\hat{h}_n(k)$ from each of the adjustment networks 140-0 through 140-(N−1). In particular, tap output $\hat{h}_0(k)$ through $\hat{h}_{N-1}(k)$ which are produced by adjustment networks 140-0 through 140-(N−1) respectively, are rectified by a respective rectifier 124-0 through 124-(N−1) the output of each being applied to max element 125 thereby producing signal $L_\infty(k)$ as output. Signal $L_\infty(k)$ is then applied to max element 126 along with δ signal 127 thereby producing signal $L'_\infty$ as output. Signal $\bar{g}(k)$ is the average of the gains $g_0(k)$ through $g_{N-1}(k)$ produced by adjustment networks 140-0 through 140-(N−1), respectively. Specifically, gain signals $g_0(k)$ through $g_{N-1}(k)$ are collectively applied to summing network 122 and then scaled by scaler 123.

As can be readily seen from FIG. 2, the weighted replicas, i.e., amplitude coefficient signals of x(k) produced by adjustment networks 140-0 through 140-(N−1) are summed via summing network 128 to generate the arbitrary system output or echo estimate signal approximating the output from arbitrary system 102. The arbitrary system output estimate is then supplied via lead 110 to a second input of combining network 109.

Those skilled in the art will recognize that it is important to appropriately adjust the individual loop gains to produce a stable system. This is realized by normalizing the loop gain by dividing it with an estimate of a prescribed characteristic of input signal x(k). A preferred embodiment of the present invention incorporating this loop gain normalization is shown in simplified block diagram form in FIG. 3.

Figure 3:
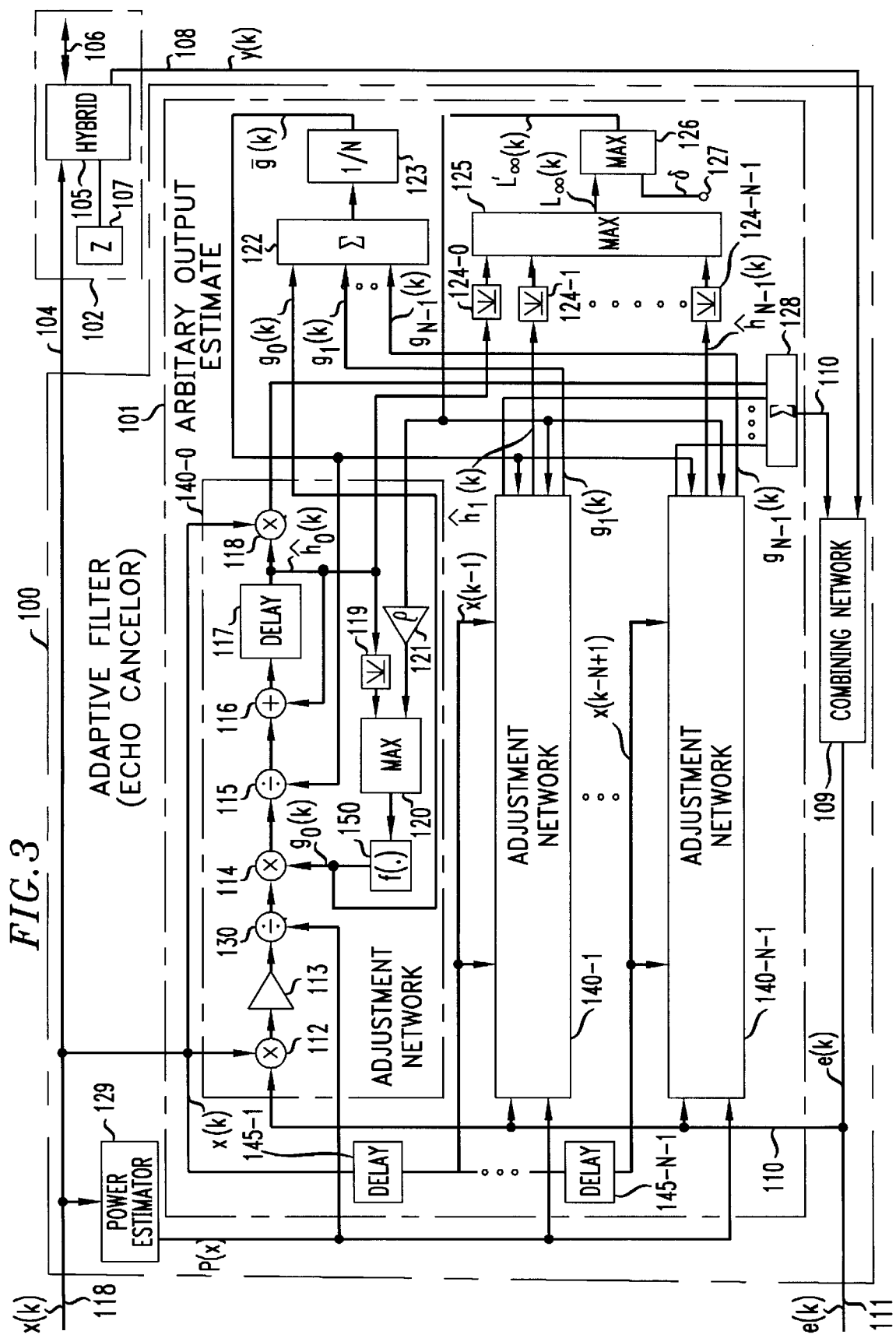
FIG. 3 shows in simplified block diagram form an adaptive filter including an alternative embodiment of the present invention.

Shown in FIG. 3, an estimate of input signal power P(x) is employed as a normalization control signal and generated by power estimator 129. The normalization control signal produced by the power estimator 129 is supplied to divider 130 in each of the adjustment networks 140-0 through 140-(N−1). Such normalization is not new, and is discussed in the article authored by D. L. Duttweiler entitled "A Twelve-Channel Digital Echo Canceler", that appeared in IEEE Transactions on Communications, Vol. COM-26, No. 5, May 1978, pp. 647–653.

Figure 4:
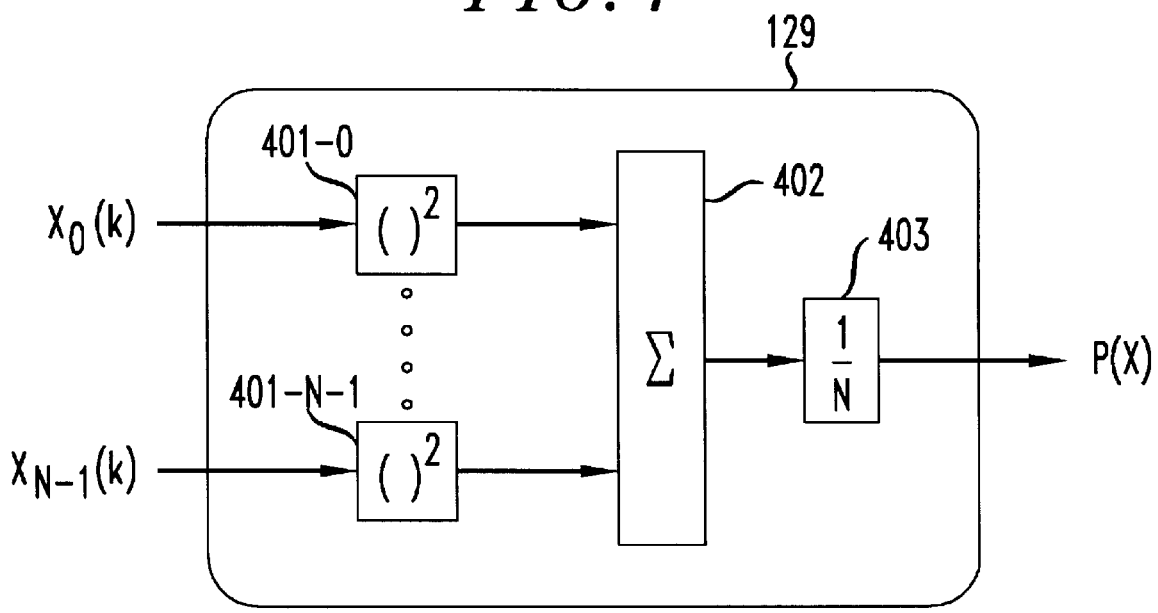
FIG. 4 shows in simplified block diagram form a power estimator as used in a preferred embodiment of the present invention.

FIG. 4 shows, in simplified block diagram form, one embodiment of power estimator, which may be utilized in accordance with the present invention. Accordingly, as shown in FIG. 4, received signals $x_0(k)$ through $x_{N-1}(k)$ are supplied to squarers 401-0 through 401-(N−1) respectively, the outputs of which are then summed by summing network 402. The average of this sum is generated by averager 403, which outputs the power estimate, P(x).

While the invention has been shown and described in detail in the context of a preferred embodiment, it will be apparent to those skilled in the art that variations and modifications are possible without departing from the broad principles and spirit of the invention which should be limited solely by the scope of the claims appended hereto.

The invention claimed is:

1. An adaptive filter for synthesizing an approximation of a system having an incoming path and an outgoing path, said adaptive filter comprising:

an adjustable signal processor means connected to the incoming path, said signal processing means including:
means for generating a plurality of amplitude coefficient signals;
means for distributing a tap gain associated with each of said amplitude coefficient signals; and
means responsive to applied signals for individually adjusting the tap gain distributor means associated with each of said plurality of amplitude coefficient signals in such a way that individual tap gains are not necessarily equal to one another and an average of the individual tap gains remains substantially constant;

means connected to the outgoing path for algebraically combining signals in the outgoing path with signals supplied from the signal processing means; and means responsive to said combined signals for adjusting said signal processing means.

2. An adaptive filter for synthesizing an approximation of a system having an incoming path and an outgoing path, said adaptive filter comprising:
- an adjustable signal processor means connected to the incoming path, said signal processing means including:
  - a delay line tapped at desired intervals; and
  - means responsive to applied signals for individually adjusting a tap gain distributor associated with each of said taps in such a way that said individual tap gains are not necessarily equal to one another and an average of the individual tap gains remains substantially constant;
- means connected to the outgoing path for algebraically combining signals in the outgoing path with signals supplied from the signal processing means; and
- means responsive to said combined signals for adjusting said signal processing means.

3. The adaptive filter according to claim 2 wherein said individual adjustment means further comprises:
- means for generating a minimum tap gain $\rho$, for each of said taps when said adjusted tap gain is less than a pre-defined threshold.

4. The adaptive filter according to claim 3 wherein said minimum adjusted tap gain $\rho$ has a value in the range of 0.001 through 1.0.

5. The adaptive filter according to claim 2 wherein said individual adjustment means adjusts the individual tap gains in accordance with an appropriate monotonic increasing function.

6. The adaptive filter according to claim 2 wherein said delay line is tapped at Nyquist intervals.

7. The adaptive filter according to claim 2 further comprising:
- means for individually normalizing a gain associated with each of said taps in response to a normalization signal.

8. The adaptive filter according to claim 7 wherein said normalization means further comprises:
- means for generating the normalization signal according to a prescribed characteristic of an applied signal.

9. The adaptive filter according to claim 8 wherein said prescribed characteristic of the applied signal is a power estimate of the applied signal.

10. An adaptive filter for synthesizing an approximation of an arbitrary system that is connected to a communication system by an incoming path and an outgoing path, said adaptive filter comprising:
- an adjustable signal processor connected to the incoming path, said signal processor including:
  - a delay line tapped at desired intervals; and
  - an output estimator responsive to applied signals for individually adjusting a tap gain distributor associated with each of said taps in such a way that said individual tap gains are not necessarily equal to one another and an average of the individual tap gains remains substantially constant;
- a combining network, connected to the outgoing path for algebraically combining signals in the outgoing path with signals supplied from the signal processor; and
- an adjustment network responsive to said combined signals for adjusting said signal processor.

* * * * *